(12) United States Patent
Chanemougame et al.

(10) Patent No.: US 10,236,296 B1
(45) Date of Patent: Mar. 19, 2019

(54) CROSS-COUPLED CONTACT STRUCTURE ON IC PRODUCTS AND METHODS OF MAKING SUCH CONTACT STRUCTURES

(71) Applicant: GLOBALFOUNDRIES Inc., Grand Cayman (KY)

(72) Inventors: Daniel Chanemougame, Niskayuna, NY (US); Emilie Bourjot, Cohoes, NY (US); Bipul C. Paul, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/861,097

(22) Filed: Jan. 3, 2018

(51) Int. Cl.
| | |
|---|---|
| *H01L 27/11* | (2006.01) |
| *H01L 29/78* | (2006.01) |
| *H01L 23/528* | (2006.01) |
| *H01L 23/535* | (2006.01) |

(52) U.S. Cl.
CPC ........ *H01L 27/1104* (2013.01); *H01L 23/528* (2013.01); *H01L 23/5283* (2013.01); *H01L 23/535* (2013.01); *H01L 29/7827* (2013.01)

(58) Field of Classification Search
CPC .......................... H01L 27/1104; H01L 23/5283
See application file for complete search history.

(56) References Cited

U.S. PATENT DOCUMENTS

| | | |
|---|---|---|
| 8,754,481 B2 | 6/2014 | Masuoka et al. |
| 9,871,103 B2 | 1/2018 | Kim et al. |
| 2004/0061153 A1 | 4/2004 | Misewich et al. |
| 2004/0113207 A1 | 6/2004 | Hsu et al. |
| 2006/0017119 A1 | 1/2006 | Jln et al. |
| 2007/0075359 A1 | 4/2007 | Yoon et al. |
| 2008/0179693 A1 | 7/2008 | Kim et al. |
| 2008/0203493 A1 | 8/2008 | Yasuda |
| 2010/0203714 A1 | 8/2010 | Masuoka et al. |
| 2014/0003133 A1 | 1/2014 | Lin et al. |
| 2015/0318288 A1 | 11/2015 | Lim et al. |

(Continued)

OTHER PUBLICATIONS

Chung et al., "Novel 4F2 DRAM Cell with Vertical Pillar Transistor (VPT)," 2011 IEEE, pp. 211-214.

(Continued)

*Primary Examiner* — Moazzam Hossain
*Assistant Examiner* — Farun Lu
(74) *Attorney, Agent, or Firm* — Amerson Law Firm, PLLC

(57) ABSTRACT

An IC product disclosed herein includes a first merged doped source/drain (MDSD) region having an upper surface, a first side surface and a second side surface that intersect one another at a corner of the first merged doped source/drain region, a second MDSD region and a contact trench in an isolation structure positioned between the first and second MDSD regions. The product also includes a conductive gate structure positioned above at least the second MDSD region and a cross-coupled contact structure that comprises a first portion positioned within the contact trench laterally adjacent to and conductively coupled to at least one of the first side surface and the second side surface, and a second portion that is positioned above and conductively coupled to the upper surface of the MDSD region, wherein the cross-coupled contact structure is conductively coupled to the conductive gate structure.

20 Claims, 16 Drawing Sheets

(56) References Cited

U.S. PATENT DOCUMENTS

2016/0133633 A1    5/2016  Liaw
2017/0256548 A1*   9/2017  Hsu .................... H01L 27/1104
2017/0287905 A1   10/2017  Morrow et al.

OTHER PUBLICATIONS

Huynh-Bao et al., "Toward the 5nm Technology: Layout Optimization and Performance Benchmark for Logic/SRAMs Using Lateral and Vertical GAA FETs".

Huynh-Bal et al., "A Comprehensive Benchmark and Optimization of 5-nm Lateral and Vertical GAA 6T-SRAMs," IEEE Transactions on Electron Devices, 63:643-51, Feb. 2016.

Sharma et al., "SRAM Design for Wireless Sensor Networks, Chapter 2 SRAM Bit Cell Optimization," Springer, 2013.

Office Action from related U.S. Appl. No. 15/804,556 dated Jul. 18, 2018.

Notice of Allowance from related U.S. Appl. No. 15/813,471 dated Jul. 5, 2018.

\* cited by examiner

CROSS-COUPLED CONTACT STRUCTURE ON IC PRODUCTS AND METHODS OF MAKING SUCH CONTACT STRUCTURES

BACKGROUND OF THE INVENTION

1. Field of the Invention

The present disclosure generally relates to the fabrication of semiconductor devices, and, more particularly, to various embodiments of a cross-coupled contact structure for integrated circuit (IC) products and various methods of making the cross-coupled contact structures.

2. Description of the Related Art

In general, memory devices are the means by which electronic information is stored. There are many types of memory devices, SRAMs (Static Random Access Memory), DRAMs (Dynamic Random Access Memory), ROMs (Read Only Memory), etc., each of which has its own advantages and disadvantages relative to other types of memory devices. For example, SRAMs are typically employed in applications where higher speed and/or reduced power consumption is important, e.g., cache memory of a microprocessor, mobile phones and other mobile consumer products, etc. Millions of such memory devices are typically included in even very basic electronic consumer products. Irrespective of the type of memory device, there is a constant drive in the industry to increase the performance and durability of such memory devices. In typical operations, an electrical charge (HIGH) is stored in the memory device to represent a digital "1", while the absence of such an electrical charge or a relatively low charge (LOW) stored in the device indicates a digital "0". Read/write circuitry is used to access the memory device to store digital information on such a memory device and to determine whether or not a charge is presently stored in the memory device. These read/write cycles typically occur millions of times for a single memory device over its effective lifetime.

FIG. 1 depicts a typical prior art configuration of a 6T (six-transistor) SRAM memory cell 10 that includes two CMOS-based inverters—INV1 and INV2. In general, the SRAM cell 10 includes two NMOS pass gate transistors PG1, PG2, two PMOS pull-up transistors PU1, PU2, and two NMOS pull-down transistors PD1, PD2. Each of the PMOS pull-up transistors PU1, PU2 has its gate (14A, 14B, respectively) connected to the gate (16A, 16B, respectively) of a corresponding NMOS pull-down transistor PD1, PD2. The PMOS pull-up transistors PU1, PU2 have their drain regions (D) connected to the drain regions of corresponding NMOS pull-down transistors PD1, PD2 to form the inverters INV1 and INV2, each of which have a conventional configuration. The source regions (S) of the PMOS pull-up transistors PU1, PU2 are connected to a high reference potential, typically Vdd. The source regions (S) of the NMOS pull-down transistors PD1, PD2 are connected to a lower reference potential, typically Vss or ground. The PMOS pull-up transistor PU1 and the NMOS pull-down transistor PD1 make up the first inverter INV1 of the SRAM cell 10. The PMOS pull-up transistor PU2 and the NMOS pull-down transistor PD2 make up the second inverter INV2 of the SRAM cell 10. The main function of an inverter is to invert the input signal applied to its input, i.e., an inverter circuit outputs a voltage representing the opposite logic level to the voltage applied to its input. If the applied input voltage is logically low, then the output voltage becomes high and vice versa.

The gate 14A of the PMOS pull-up transistor PU1 and the gate 16A of the NMOS pull-down transistor PD1 are cross-coupled (i.e., connected) to the drain regions (D) of the transistors PU2, PD2 of the other inverter at node N2. Similarly, the gate 14B of the PMOS pull-up transistor PU2 and the gate 16B of the NMOS pull-down transistor PD2 are cross-coupled (i.e., connected) to the drain regions (D) of the transistors PU1, PD1 at node N1. Hence, the potential present on the drain regions of the transistors PU1, PD1 (node N1) of the first inverter is applied to the gates of transistors PU2, PD2 of the second inverter and the charge serves to keep the second inverter in an ON or OFF state. The logically opposite potential is present on the drain regions of the transistors PU2, PD2 (node N2) of the second inverter and on the gates of the transistors PU1, PD1 of the first inverter, keeping the first inverter in the complementary OFF or ON state relative to the second inverter. Thus, the latch of the illustrated SRAM cell 10 has two stable states: a first state with a predefined potential present on charge storage node N1 and a low potential on charge storage node N2; and a second state with a low potential on charge storage node N1 and the predefined potential on charge storage node N2. Binary data are recorded by toggling between the two states of the latch. Sufficient charge must be stored on the charge storage node, and thus on the coupled gates of the associated inverter, to unambiguously hold one of the inverters "ON" and unambiguously hold the other of the inverters "OFF", thereby preserving the memory state. The stability of an SRAM cell 10 can be quantified by the margin by which the potential on the charge storage nodes can vary from its nominal value while still keeping the SRAM 10 cell in its original state. In manufacturing such an SRAM cell 10, a conductive contact structure must be formed to cross-couple (or conductively couple) a shared drain region on the first inverter with a gate structure of the second inverter.

The present disclosure is directed to various embodiments of cross-coupled contact structures for IC products and various methods of making such cross-coupled contact structures.

SUMMARY OF THE INVENTION

The following presents a simplified summary of illustrative embodiments of the invention in order to provide a basic understanding of some aspects of the illustrative embodiments of the invention. This summary is not an exhaustive overview of the illustrative embodiments of the invention specifically discussed herein. It is not intended to identify key or critical elements of the invention or to delineate the scope of the invention. Its sole purpose is to present some concepts in a simplified form as a prelude to the more detailed description that is discussed later.

Generally, the present disclosure is directed to various embodiments of cross-coupled contact structures for IC products and various methods of making such cross-coupled contact structures. One illustrative IC product disclosed herein includes a first merged doped source/drain region that includes an upper surface, a first side surface and a second side surface that intersect one another at a corner of the first merged doped source/drain region, a second merged doped source/drain region, an isolation structure positioned between the first merged doped source/drain region and the second merged doped source/drain region and a contact trench formed in the isolation structure. In this example, the product also includes a conductive gate structure for at least one transistor device, the conductive gate structure being positioned above at least the second merged doped source/drain region and a cross-coupled contact structure that comprises a first portion positioned within the contact trench laterally adjacent to and conductively coupled to at least one of the first side surface and the second side surface and a second portion that is positioned above and conductively coupled to the upper surface of the first merged doped source/drain region, wherein the cross-coupled contact structure is conductively coupled to the conductive gate structure.

One illustrative method disclosed herein includes forming first and second merged doped source/drain regions, the first merged doped source/drain region comprising an upper surface, a first side surface and a second side surface, wherein the first and second side surfaces intersect one another at a corner of the first merged doped source/drain region, and forming a contact trench in an isolation structure positioned between the first merged doped source/drain region and the second merged doped source/drain region, the contact trench exposing at least a portion of at least one of the first side surface and the second side surface. In this example, the method also includes forming a conductive gate structure for at least one transistor device, the conductive gate structure being positioned above at least the second merged doped source/drain region, and forming a cross-coupled contact structure having a first portion that is positioned within the trench laterally adjacent to and conductively coupled to at least one of the first side surface and the second side surface and a second portion that is positioned vertically above and conductively coupled to the upper surface, wherein the cross-coupled contact structure is conductively coupled to the conductive gate structure.

BRIEF DESCRIPTION OF THE DRAWINGS

The disclosure may be understood by reference to the following description taken in conjunction with the accompanying drawings, in which like reference numerals identify like elements, and in which.

Figure 1:
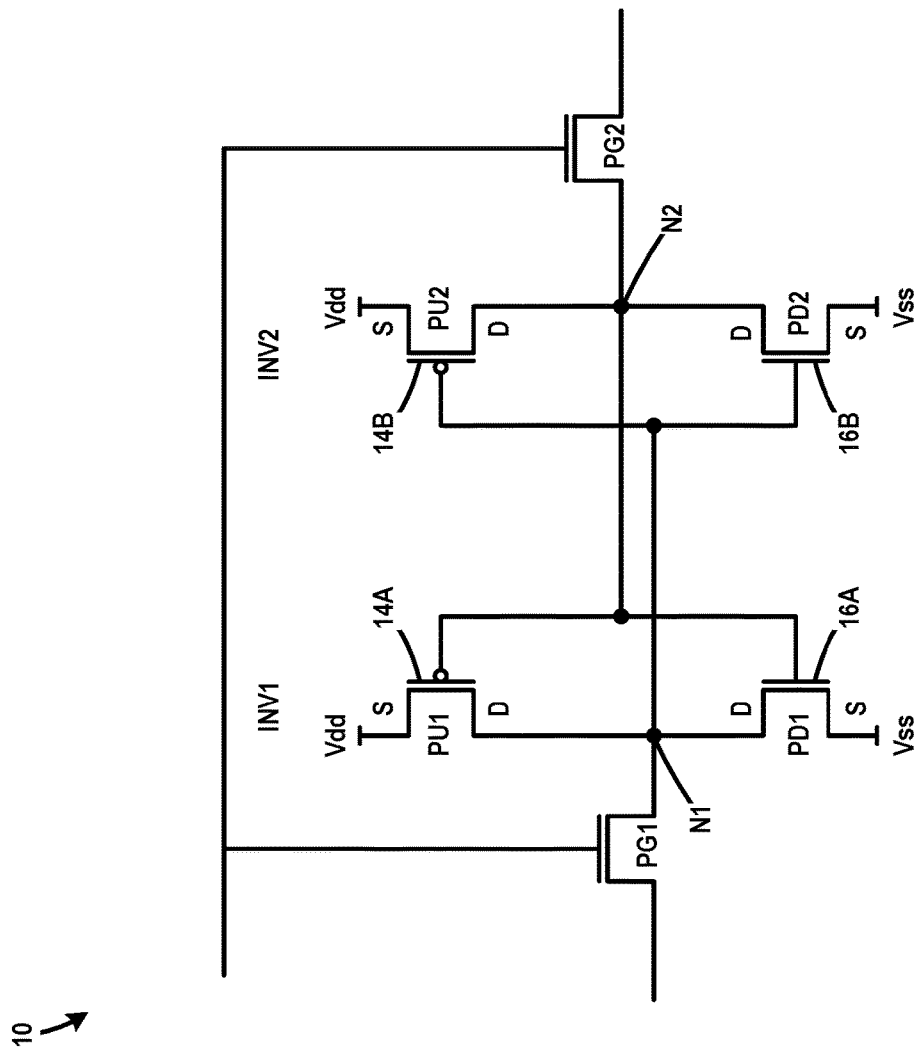
FIG. 1 is an electrical schematic of an illustrative prior art SRAM cell that includes two CMOS-based inverters.

While the subject matter disclosed herein is susceptible to various modifications and alternative forms, specific embodiments thereof have been shown by way of example in the drawings and are herein described in detail. It should be understood, however, that the description herein of specific and illustrative embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. The various layers of material described below may be formed by any of a variety of different known techniques, e.g., a chemical vapor deposition (CVD) process, an atomic layer deposition (ALD) process, a thermal growth process, epitaxial growth processes, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 2-18 are various views that depict the various embodiments of cross-coupled contact structures for an IC product 100 and various methods of making such cross-coupled contact structures. The presently disclosed illustrative embodiments of the inventions will be discussed in the context where the cross-coupled contact structures disclosed herein may be formed on an illustrative six-transistor (6T) SRAM cell that includes six illustrative vertical transistor devices 104. However, as will be appreciated by those skilled in the art after a complete reading of the present application, the cross-coupled contact structures disclosed herein may be employed in other applications than the depicted SRAM cell. Thus, the presently disclosed inventions should not be considered to be limited to the illustrative SRAM application disclosed herein.

Figure 2:
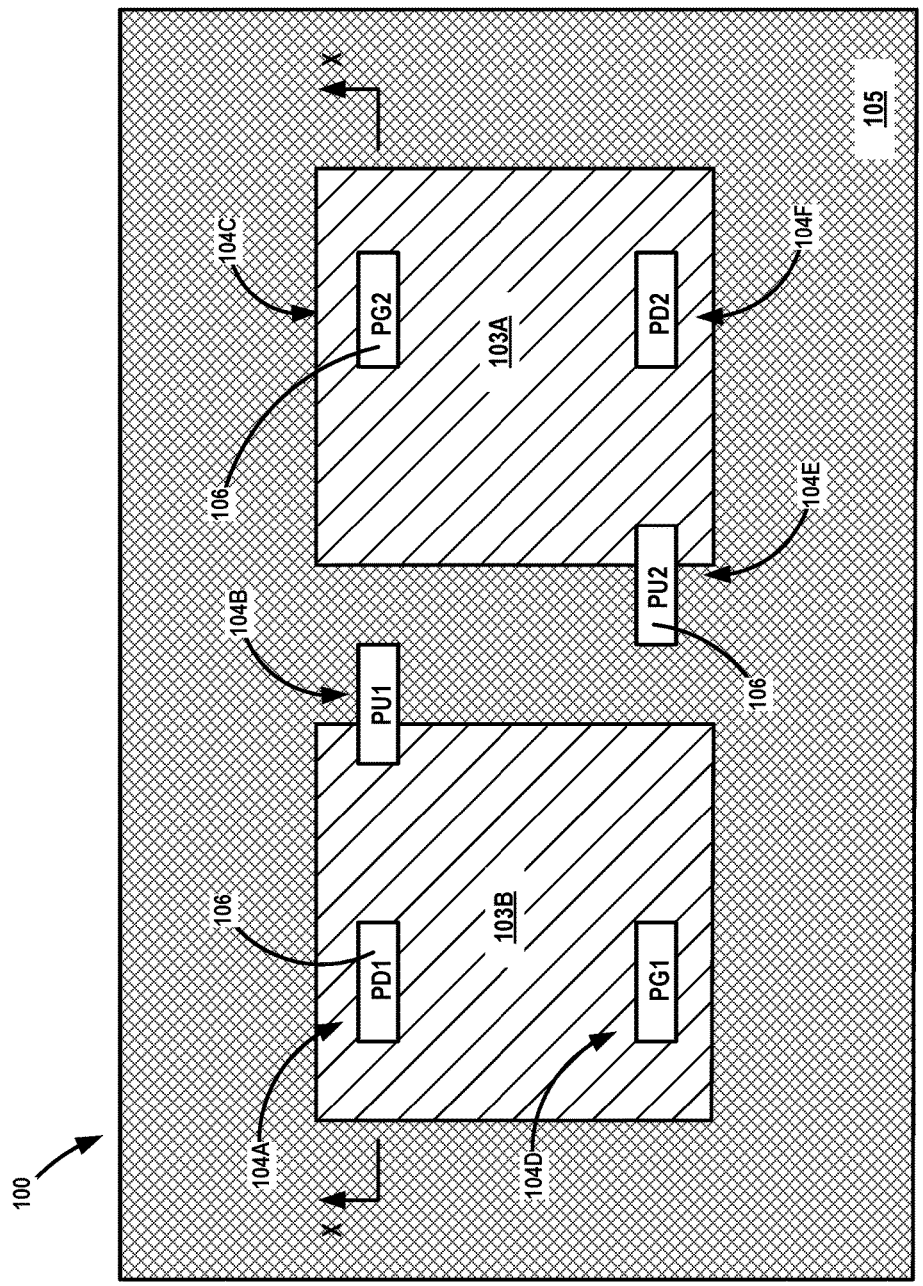
FIGS. 2-18 are various views that depict various embodiments of cross-coupled contact structures for IC products and various methods of making such cross-coupled contact structures.

FIG. 2 is a simplistic plan view of an embodiment of the IC product 100 that includes an illustrative SRAM cell. The SRAM cell includes six illustrative and schematically depicted vertical transistor devices 104A-104F (generally referenced using the numeral 104) that are formed above an illustrative semiconductor substrate 102 (see FIG. 8). In general, the IC product 100 includes two NMOS pass gate transistors PG1 (104D), PG2 (104C), two PMOS pull-up transistors PU1 (104B), PU2 (104E), and two NMOS pull-down transistors PD1 (104A), PD2 (104F). Each of the vertical transistors 104 includes a simplistically depicted vertically oriented channel semiconductor (VOCS) structure 106. However, as will be appreciated by those skilled in the art, the drawings provided herein depict the formation of cross-coupled contact structures at a given point in the process flow disclosed herein. It should be understood that these drawings are not intended to, nor do they, show the full, final formation of functional vertical transistor devices 104. For example, each of the vertical transistor devices 104 would include a top source/drain region (not shown). However, such details regarding the formation of fully functional vertical transistor devices have been omitted.

Figure 3:
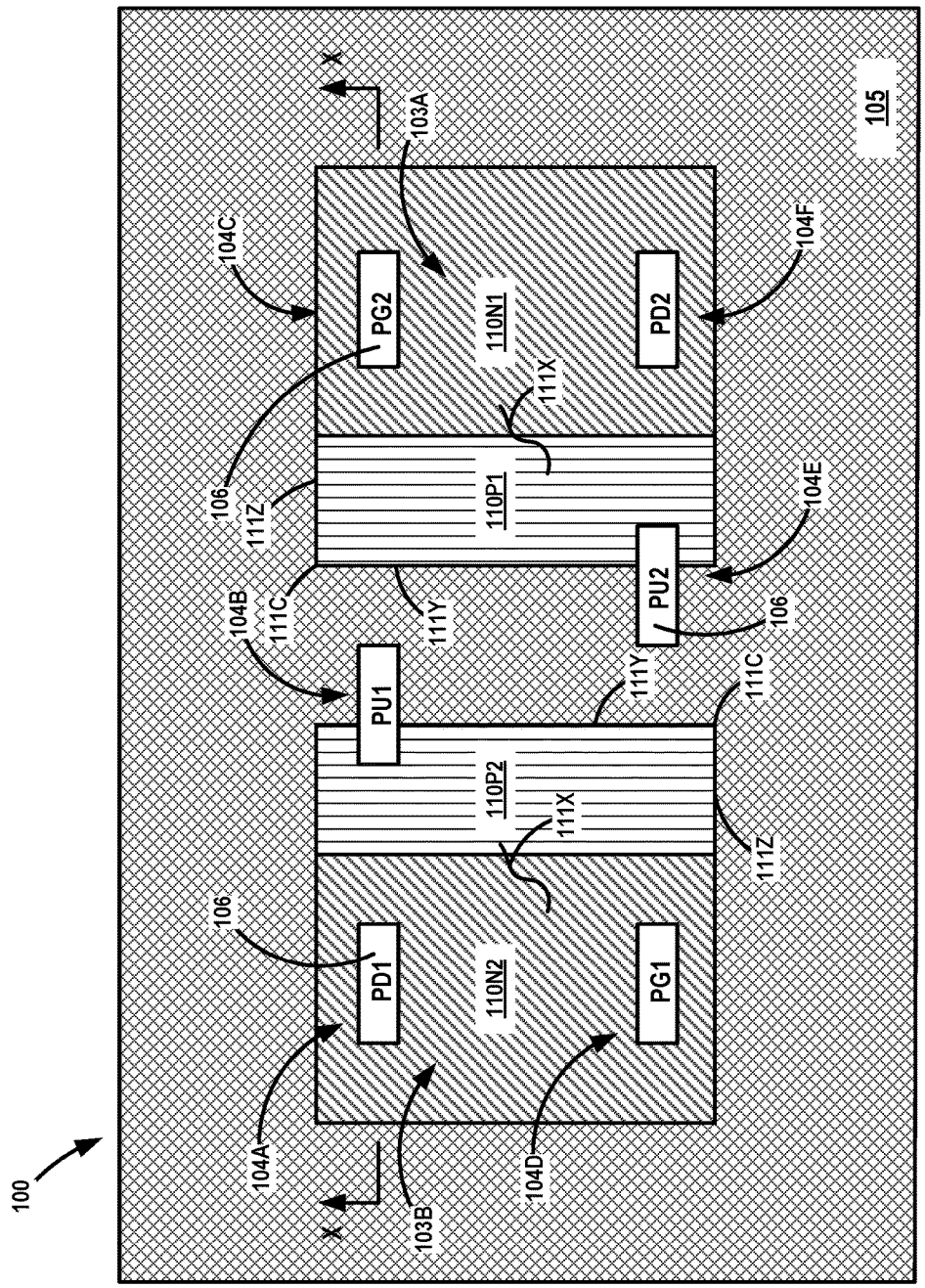

With reference to FIGS. 2 and 3, and as disclosed more fully below, in the depicted example, the transistors 104 are formed above two substantially rectangular-shaped (when viewed from above) merged doped source/drain regions—a first merged doped source/drain region 103A and a second merged doped source/drain region 103B (collectively referenced using the numeral 103). However, the presently disclosed subject matter should not be considered to be limited to any particular form or configuration of the merged doped source/drain regions 103. As shown in FIG. 3, after fabrication is completed, each of the merged doped source/drain regions comprises two oppositely doped regions that engage one another along an interface. More specifically, in the example depicted herein, the first merged doped source/drain region 103A will comprise a first N-doped region 110N1 and a first P-doped region 110P1, while the second merged doped source/drain region 103B comprises a second N-doped region 110N2 and a second P-doped region 110P2. As described more fully below, these N and P type doped regions may be formed in a semiconductor material, i.e., either in an epitaxial semiconductor material formed above a semiconductor substrate or in the semiconductor substrate itself. These N and P type doped regions are "merged" since there is no isolation material positioned between the doped regions within a single merged doped source/drain region 103, e.g., the first P-doped region 110P1 directly engages the first N-doped region 110N1 along an interface within the first merged doped source/drain region 103A. With continuing reference to FIG. 3, each of the merged doped source/drain regions 103 has an upper surface 111X (see also, e.g., FIGS. 6 and 7), a first substantially vertically oriented side surface 111Y and a second substantially vertically oriented side surface 111Z. The substantially planar side surfaces 111Y, 111Z intersect one another at a substantially vertically oriented corner 111C. In the depicted example, the corner 111C is formed at a substantially right angle. The doped regions 110N1, 110P1, 110P2 and 110N2 will not be depicted in any of the other plan view drawings depicted herein so as not to overly complicate the drawings. Several of the drawings herein are cross-sectional drawings depicting the view taken at the location indicated by arrows X-X in FIG. 3, i.e., a cross-sectional view taken through the PD1, PU1 and PG2 transistors and the merged source/drain regions 103A, 103B.

Figure 4:
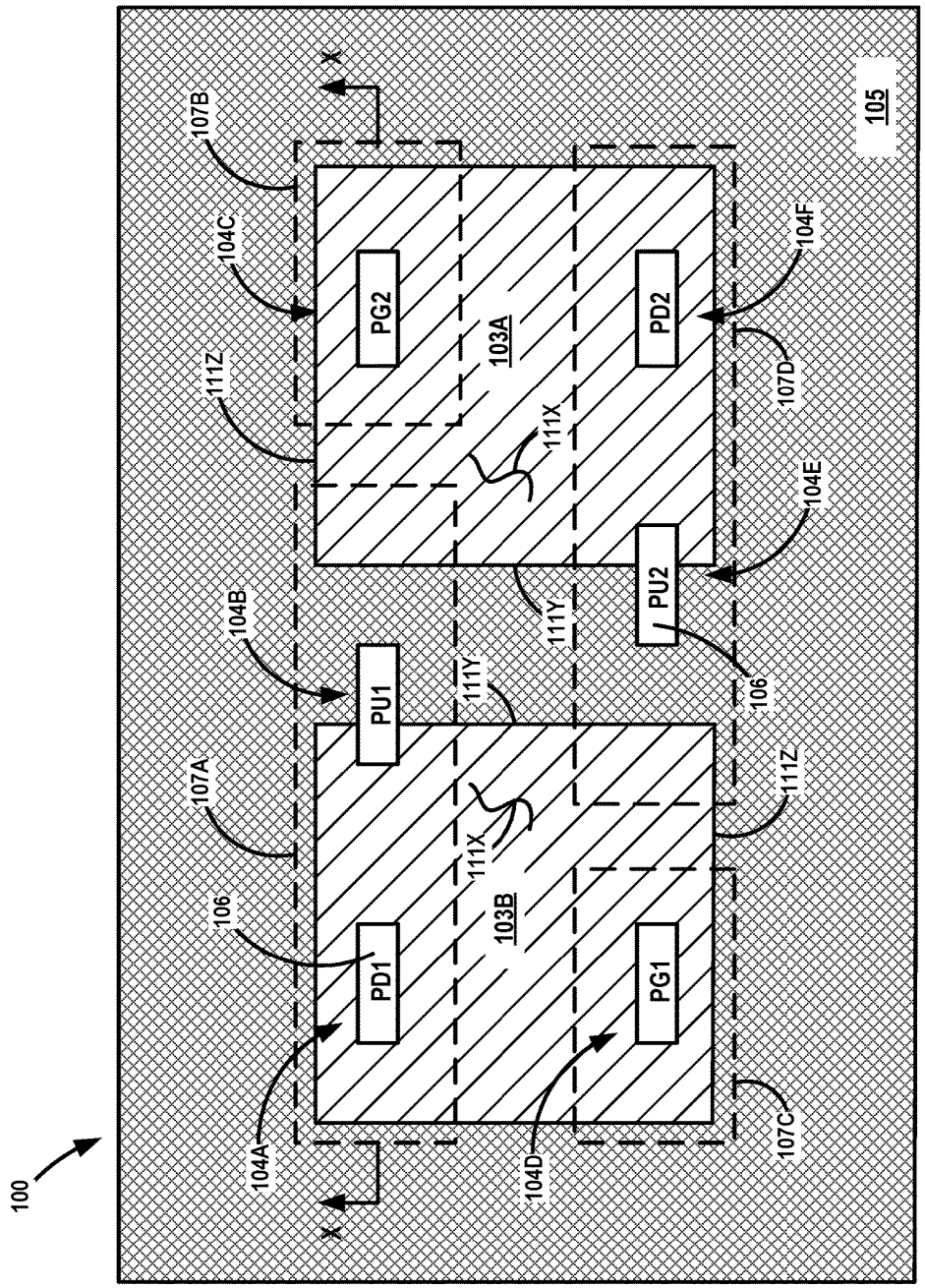

FIG. 4 depicts (in dashed lines) where various separate and discrete conductive gate structures 107A-D (generally referenced using the numeral 107) will be formed for the various transistor devices. The conductive gate structures 107 for the transistor devices 104 may be formed using either gate-first or replacement gate manufacturing techniques. Note that the gate structure 107A will be shared by the PD1 transistor and the PU1 transistor, while the gate structure 107D will be shared by the PD2 transistor and the PU2 transistor. Each of the PG1 transistor and PG2 transistor has their own discrete gate structure 107C, 107B, respectively. Also note that the conductive gate structure 107A extends across the entire width of the second merged doped source/drain region 103B and is positioned only partially above the first merged doped source/drain region 103A. Similarly, the conductive gate structure 107D extends across the entire width of the first merged doped source/drain region 103A and is positioned only partially above the second merged doped source/drain region 103B.

Figure 5:
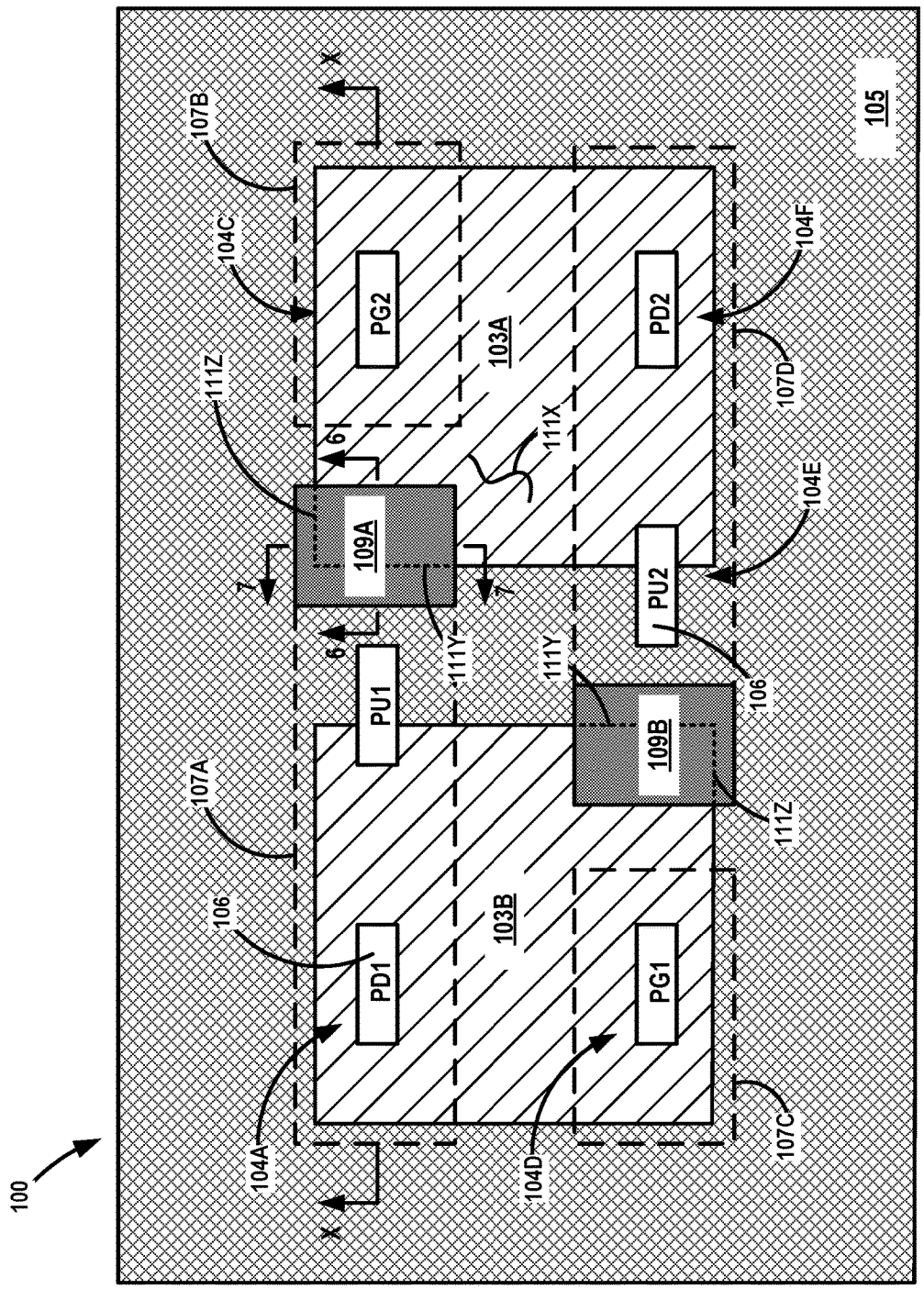

With reference to FIG. 5, for the IC product 100 to function for its intended purpose, the shared gate structure 107A must be conductively coupled to the first merged doped source/drain region 103A, and the shared gate structure 107D must be conductively coupled to the second merged doped source/drain region 103B. Using the methods described more fully below, and as shown in FIG. 5, a first cross-coupled contact structure 109A is formed to conductively couple the shared gate structure 107A to the first merged doped source/drain region 103A, while a second cross-coupled contact structure 109B is formed to conductively couple the shared gate structure 107D to the second merged doped source/drain region 103B. The first and second cross-coupled contact structures 109A, 109B are mirror images of one another and they will be collectively referenced using the reference numeral 109.

Figures 6, 7:
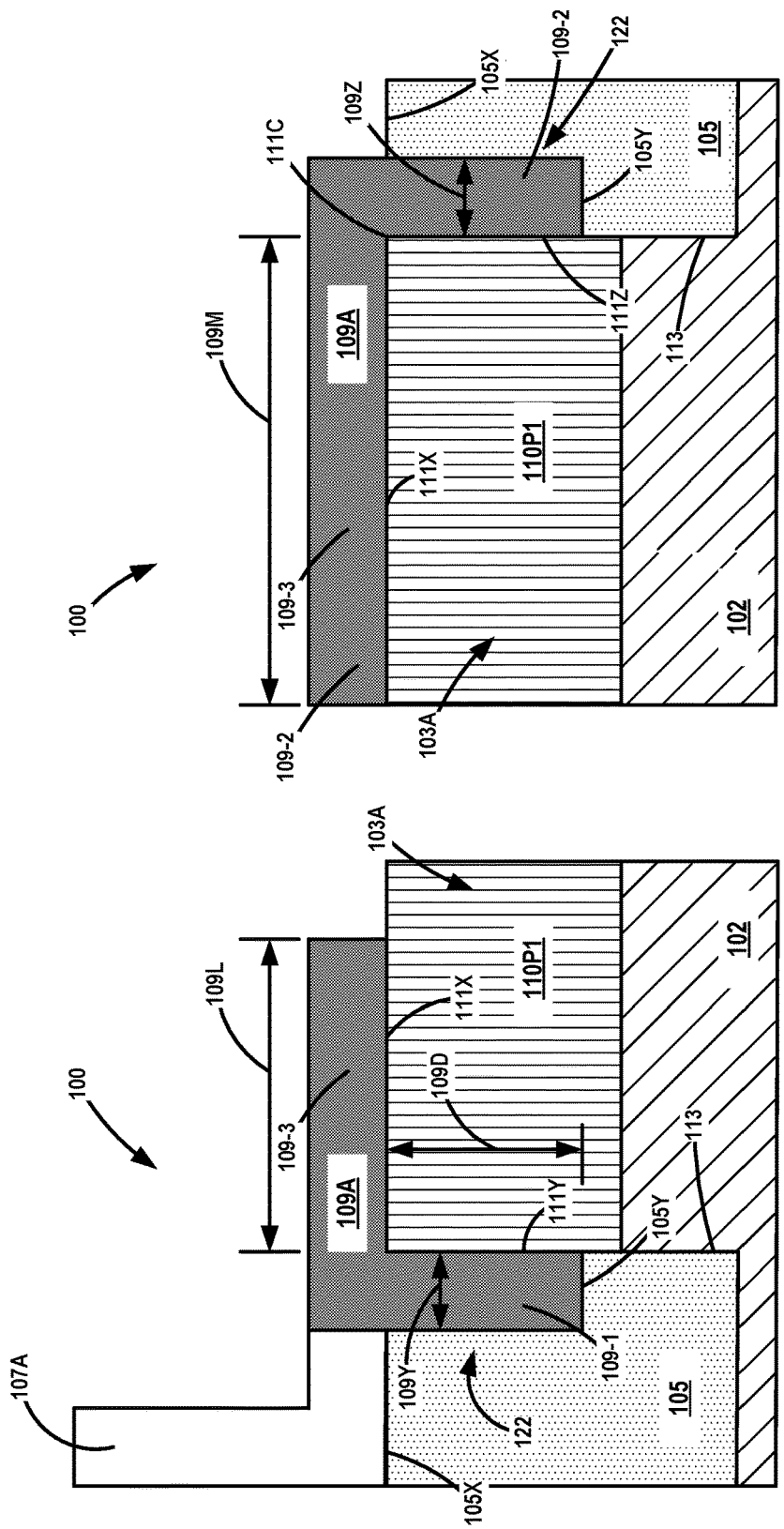

FIGS. 6 and 7 depict cross-sectional views of one illustrative embodiment of a cross-coupled contact structure 109 disclosed herein. The views depicted in FIGS. 6 and 7 are taken where indicated in FIG. 5. As noted above, the second cross-coupled contact structure 109B has the same configuration as the first cross-coupled contact structure 109A. The contact structure 109A is conductively coupled to the simplistically depicted shared gate structure 107A. With reference to FIGS. 6 and 7, a downwardly extending first portion of one illustrative embodiment of the cross-coupled contact structure 109 disclosed herein is positioned within a contact trench 122 formed in the isolation structure 105. In one illustrative example, the isolation structure 105 comprises an upper surface 105X and the contact trench 122 is defined, in part, by a lower surface 105Y in the isolation structure 105. In the example shown in FIGS. 6 and 7, the contact trench 122 is a continuous trench that exposes at least portions of the side surface 111Y, the corner 111C and the side surface 111Z. However, as described more fully below, in some illustrative examples, the contact trench 122 can be formed so as to expose only one of the side surfaces 111Y, 111Z.

As shown in FIGS. 6 and 7, in one illustrative embodiment, the contact structure 109A comprises first and second portions. The first portion of the contact structure 109A is a downwardly extending portion that comprises the portion 109-1 and the portion 109-2. The second portion of the contact structure 109A includes the substantially horizontally oriented portion 109-3 that is positioned above a portion of the upper surface 111X of the merged doped source/drain region 103A. In one example, the downwardly extending portion 109-1 of the cross-coupled contact structure 109A extends downwardly into the trench 122 and it is conductively coupled to a portion of the substantially planar side surface 111Y of the P-doped region 110P1 of the first merged doped source/drain region 103A. In this particular example, the first portion 109-1 of the cross-coupled contact structure 109A is positioned in the contact trench 122 and laterally between the isolation structure 105 and the first merged doped source/drain region 103A. In one particular embodiment, the substantially vertically oriented portion 109-1 of the cross-coupled contact structure 109A extends downwardly into the contact trench 122 and it physically contacts the substantially planar side surface 111Y of the P-doped region 110P1 in the first merged doped source/drain region 103A.

As shown in FIG. 7, in one illustrative embodiment, the portion 109-2 of the cross-coupled contact structure 109A extends downwardly into the contact trench 122 and it is conductively coupled to a first portion of the substantially planar side surface 111Z of the P-doped region 110P1 of the first merged doped source/drain region 103A. In one particular embodiment, the second substantially vertically oriented portion 109-2 of the cross-coupled contact structure 109A extends downwardly into the trench 122 and physically contacts the substantially planar side surface 111Z of the P-doped region 110P1 in the first merged doped source/drain region 103A. The first portion of the contact structure 109A also extends downwardly into the contact trench 122 and conductively contacts the corner 111C of the first merged doped source/drain region 103A.

As shown in FIGS. 6 and 7, in one illustrative embodiment, a second portion (i.e., the portion 109-3) of the cross-coupled contact structure 109A is positioned vertically above and conductively coupled to the P-doped region 110P1 of the first merged doped source/drain region 103A. The conductive coupling between the contact structure 109A and the P-doped region 110P1 of the first merged doped source/drain region 103A may be made directly or via an intermediate conductive material such as a metal silicide layer formed above the upper surface 111X of the P-doped region 110P1 of the first merged doped source/drain region 103A. In one particular embodiment, the portion 109-3 of the cross-coupled contact structure 109A physically contacts the substantially planar upper surface 111X of the P-doped region 110P1 in the first merged doped source/drain region 103A.

As will be appreciated by those skilled in the art after a complete reading of the present application, the presently disclosed subject matter is directed to various embodiments of a contact structure 109. For example, with respect to the illustrative embodiment shown in FIGS. 6 and 7, the first portion of the contact structure 109A, (i.e., the first and second portions 109-1, 109-2) essentially wraps around the substantially vertically oriented corner 111C of the P-doped region 110P1 in the first merged doped source/drain region 103A, while the second portion of the contact structure 109A (i.e., the portion 109-3) is positioned vertically above a portion of the upper surface 111X of the merged doped source/drain region 103A. As depicted, in this illustrative embodiment, the cross-coupled contact structure 109 essentially surrounds the corner 111C of the first merged doped source/drain region 103A. However, as explained more fully below, other embodiments of the contact structures 109 disclosed herein may physically contact only one of the side surfaces 111Y, 111Z, i.e., the portion 109-1 or 109-2 may be omitted.

The various embodiments of the cross-coupled contact structures 109 disclosed herein provide for a more robust cross-coupled contact structure in that, in lieu of simply contacting the upper surface 111X of the merged doped source/drain regions 103, the cross-coupled contact structure 109 disclosed herein contacts a larger surface area. That is, in addition to contacting the upper surface 111X, the contact structures 109 disclosed herein contact at least one (and sometimes both) of the substantially vertically oriented side surfaces 111Y, 111Z of the merged doped source/drain regions 103 that are exposed by formation of the contact trench 122 in the isolation structure 105. In even further embodiments, the cross-coupled contact structures 109 may physically contact all of the surfaces 111X, 111Y, 111C and 111Z of the merged doped source/drain regions 103.

The physical dimensions of the cross-coupled contact structures 109 may vary depending upon the particular application. With reference to FIGS. 6 and 7, in one illustrative embodiment, the portion 109-1 of the cross-coupled contact structures 109 may extend into the contact trench 122 for a depth 109D of about 5-20 nm, and it may have a lateral thickness 109Y of about 5-15 nm. In one illustrative embodiment, the portion 109-2 of the cross-coupled contact structures 109 may also extend into the contact trench 122 for the depth 109D, however such a configuration may not be required or present in all applications. The portion 109-2 of the cross-coupled contact structures 109 may also have a lateral thickness 109Z of about 5-15 nm. In some applications, the thicknesses 109Y and 109Z may be approximately the same, but that may not be the case in some applications. As shown in FIGS. 6 and 7, the portion 109-3 of the cross-coupled contact structures 109 is positioned vertically above at least a portion of the upper surface 111X of the merged doped source/drain regions 103A. In one particular embodiment, the portion 109-3 of the cross-coupled contact structures 109 may physically contact a portion of the upper surface 111X of the merged doped source/drain regions 103. In one particular embodiment, the portion 109-3 may extend a first distance 109L from the side surface 111Y (in a direction substantially parallel of a long axis of the gate structure 107A), and a second distance 109M from the side surface 111Z (in a direction transverse to the long axis of the gate structure 107A). In one illustrative embodiment, the first distance 109L may be on the order of about 5-20 nm, while the second distance 109M may be about 5-20 nm. The distances 109L, 109M may be about the same or they may be different depending upon the particular application.

FIGS. 8-18 are cross-sectional views depicting one illustrative process flow for forming the illustrative vertical transistor devices 104 and the contact structures 109 disclosed herein. These drawings depict the formation of only the cross-coupled contact structure 109A, but both of the cross-coupled contact structures 109 are mirror images of one another and they will be formed at the same time using the same process flow. Of course, as will be appreciated by those skilled in the art after a complete reading of the present application, the vertical transistor devices 104 disclosed herein may be formed using a variety of different manufacturing techniques and materials, and such transistors 104 may have a variety of different configurations. However, the presently disclosed illustrative embodiments of the various inventions disclosed herein should not be considered to be limited to use with products containing vertical transistor devices. Moreover, as noted above, the drawings provided herein show the formation of the cross-coupled contact structures 109 at a given point in the process flow disclosed herein. It should be understood that these drawings are not intended to, nor do they, show the full, final formation of functional vertical transistor devices 104. For example, each of the vertical transistor devices 104 would include a top source/drain region (not shown) and perhaps other components, structures and layers of material that are also not shown. Such details regarding the formation of fully functional vertical transistor devices are not shown, but they are well known to those skilled in the art. Thus, the presently disclosed inventions should not be considered to be limited to any particular form of transistor device, its materials of construction or the manner in which it is formed.

The IC product 100 is formed in and above a semiconductor substrate 102. The substrate 102 may have a variety of configurations, such as the bulk substrate configuration depicted herein or a semiconductor-on-insulator (SOI) configuration. Such an SOI substrate includes a bulk semiconductor layer, a buried insulation layer positioned on the bulk semiconductor layer and an active semiconductor layer positioned on the buried insulation layer, wherein the transistor devices 104 are formed in and above the active layer.

The active layer and/or the bulk semiconductor layer may be made of silicon or they may be made of semiconductor materials other than silicon, and they both do not have to be made of the same semiconductor material. Thus, the terms "substrate" or "semiconductor substrate" should be understood to cover all semiconducting materials and all forms of such materials.

Figure 8:
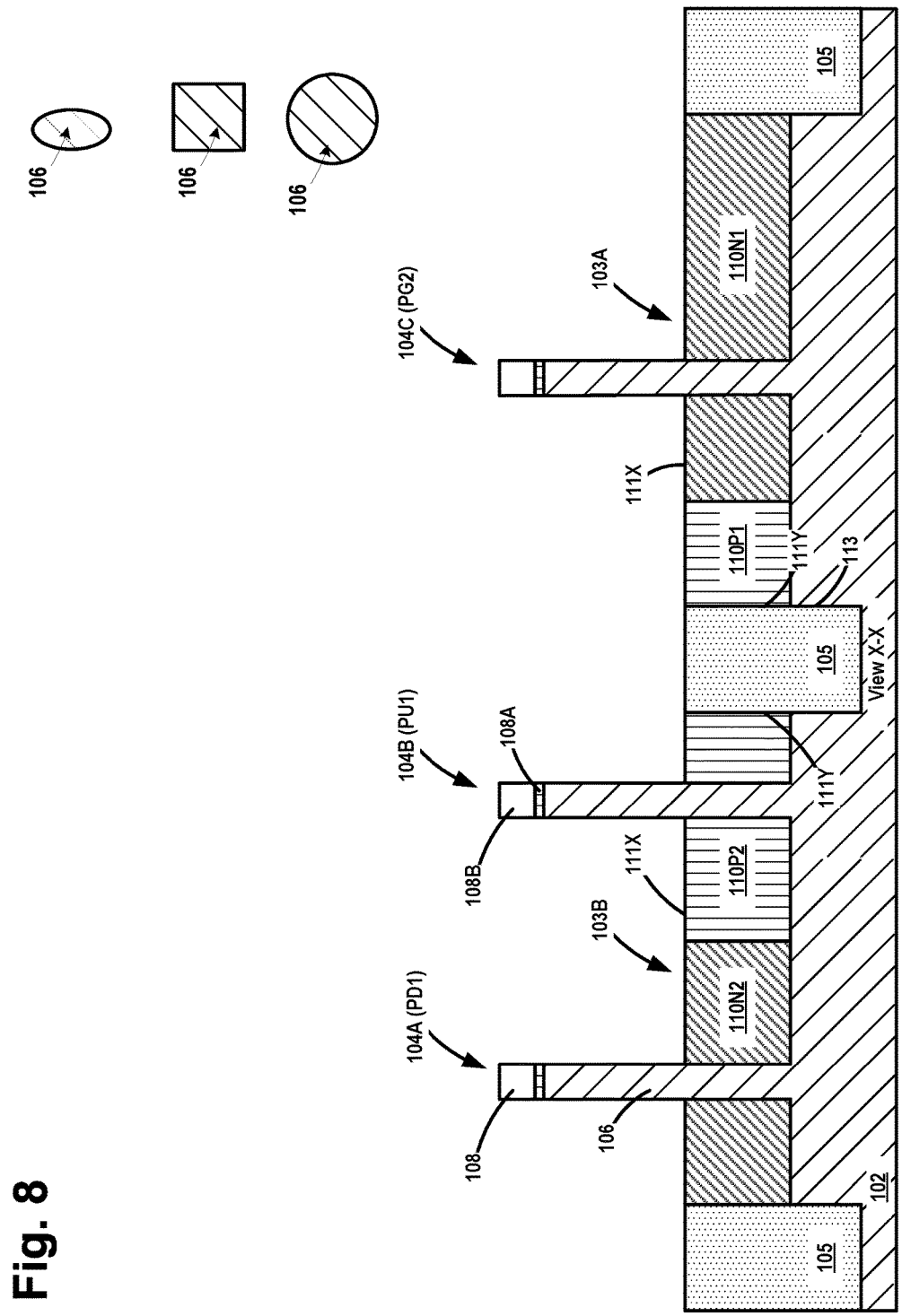

FIG. 8 depicts the IC product 100 after several known process operations were performed. The IC product 100 comprises several structures and components at this stage of processing operations: a plurality of VOCS structures 106, a patterned etch mask 108 (comprised of layers 108A (e.g., silicon dioxide) and 108B (e.g., a layer of silicon nitride)), an isolation structure 105 (e.g., such as silicon dioxide), a first merged source/drain region 103A (comprised of an N-doped bottom source/drain region 110N1 and a P-doped bottom source/drain region 110P1) and a second merged source/drain region 103B (comprised of an N-doped bottom source/drain region 110N2 and a P-doped bottom source/drain region 110P2). The merged source/drain regions 103 may have a variety of different configurations (when viewed from above) and they may have a substantially planar upper surface 111X. In the illustrative examples depicted herein, the VOCS structures 106 have a substantially rectangular cross-section when viewed from above. In other embodiments, the VOCS structures 106 may have different cross-sectional shapes, such as circle, oval, square, etc., as shown in the upper right-hand portion of FIG. 8. The merged source/drain regions 103 may have a substantially planar upper surface 111X. The various structures and regions depicted in FIG. 8 may be formed by performing a variety of different known manufacturing techniques and using a variety of different materials. The isolation structure 105 may comprise an insulating material, such as silicon dioxide. The isolation structure 105 may also comprise one or more conformal liner layers (not separately shown) that were deposited in the isolation trenches 113 prior to overfilling the isolation trenches 113 with insulation material. With continuing reference to FIG. 8, the N-doped source/drain region 110N1 is formed for the N-type transistors PD2, PG2, respectively, in the first merged source/drain region 103A. The source/drain region 110P1 is formed for the P-type transistor PU2 in the first merged source/drain region 103A. The N-doped bottom source/drain region 110N2 is formed for the N-type transistors PD1, PG1, respectively, in the second merged source/drain region 103B. The source/drain region 110P2 is formed for the P-type transistor PU1 in the second merged source/drain region 103B. As mentioned above, a portion of the isolation structure 105 is positioned laterally between the merged doped source/drain regions 103A and 103B. The dopant concentration and depth of the various doped regions shown herein may vary depending upon the particular application. At some point during the process flow, the product may be subjected to at least one anneal process. During that at least one anneal process, dopants from the bottom doped source/drain regions will migrate laterally into the VOCS structures 106, but such migrated dopants are not depicted so as not to overly complicate the drawings.

Figure 9:
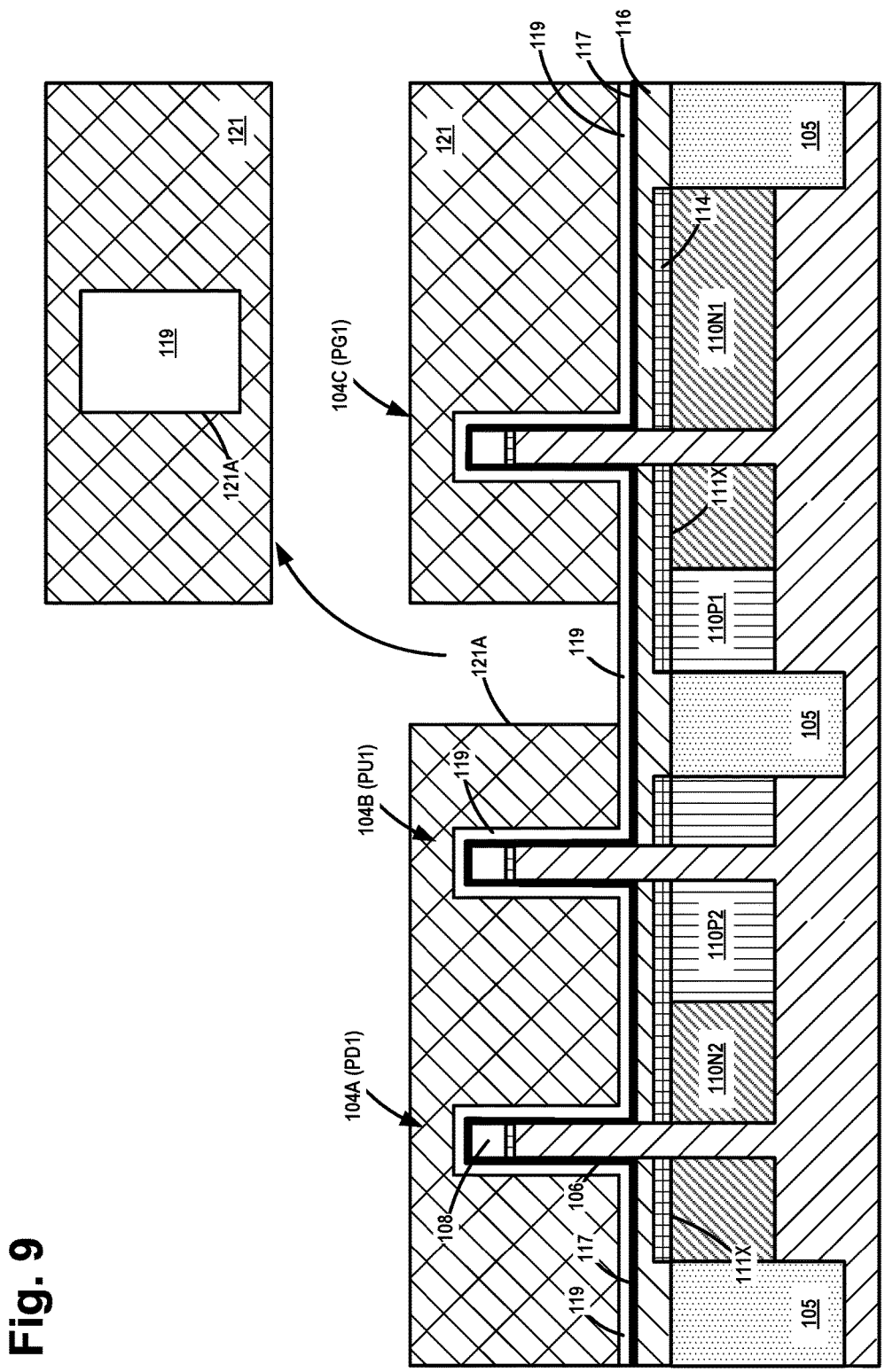

FIG. 9 depicts the IC product 100 after several process operations were performed. First, a conductive layer of material, such as a metal silicide layer 114, was formed on and in physical contact with the upper surfaces 111X of the bottom doped source/drain regions (110N1, 110N2, 110P1, 110P2) using traditional manufacturing techniques and materials that are well known to those skilled in the art. The metal silicide layer 114 may be formed to any desired thickness, and it may be comprised of any desired conductive material, e.g., cobalt silicide, titanium silicide, etc. Various protective spacers that are formed on sidewalls the VOCS structures 106 to prevent formation of the metal silicide material during this process are not depicted. Note that the metal silicide material 114 does not form on the isolation structure 105. The metal silicide material 114 need not be formed in all applications.

Still referencing FIG. 9, a continuous layer of bottom spacer material 116 (e.g., a low-k insulating material (k value of 7 or less), silicon dioxide, etc.) was formed above the metal silicide material 114 around all of the VOCS structures 106 using traditional manufacturing techniques and materials that are well known to those skilled in the art. The continuous layer of bottom spacer material 116 may not be present in all applications In the example depicted herein, the methods and devices will be described in the context where a gate-first manufacturing technique was performed to form the conductive gate structures for the transistors 104. Accordingly, still referencing FIG. 9, a conformal deposition process, e.g., an atomic layer deposition (ALD) process, was performed to form a relatively thin (e.g., 2-5 nm) continuous gate insulation (or gate dielectric) layer 117. The gate insulation layer 117 may be comprised of a material such as silicon dioxide or a high-k (k value greater than 10) insulating material. Then, a conformal sacrificial protection layer 119 was formed above the gate insulation layer 117 by performing a conformal deposition process. The conformal sacrificial protection layer 119 may be comprised of a variety of different materials and it may be formed to any desired thickness. In general, the conformal sacrificial protection layer 119 should be made of a material that exhibits good etch selectivity with respect to the gate insulation layer 117. In one illustrative embodiment, the conformal sacrificial protection layer 119 may be made of materials such as, for example, titanium nitride, etc., and it may be formed to any desired thickness (e.g., 1-6 nm.) In the depicted example, the gate insulation layer 117 is a continuous layer of material. In other applications, such a gate insulation layer 117 may only be formed on the sidewalls of the VOCS structures 106, e.g., in the case where the gate insulation layer is formed by performing an oxidation process.

Also depicted in FIG. 9 is a patterned etch mask 121, e.g., a patterned OPL layer that was formed above the conformal sacrificial protection layer 119. The patterned etch mask 121 has a plurality of openings 121A (one for each of the cross-coupled contacts 109 to be formed in a manner described more fully below) that each have a generally rectangular configuration when viewed from above, as shown in the simplistic plan view included in FIG. 9. The patterned etch mask 121 was formed by initially blanket depositing the OPL material of the patterned etch mask 121 above the substrate 102. Thereafter, a patterned layer of photoresist (not shown) was formed above the deposited layer of OPL material. At that point, an etching process was performed to produce the patterned etch mask 121, and the patterned layer of photoresist was subsequently removed. As depicted, the opening 121A exposes a portion of the conformal sacrificial protection layer 119.

Figure 10:
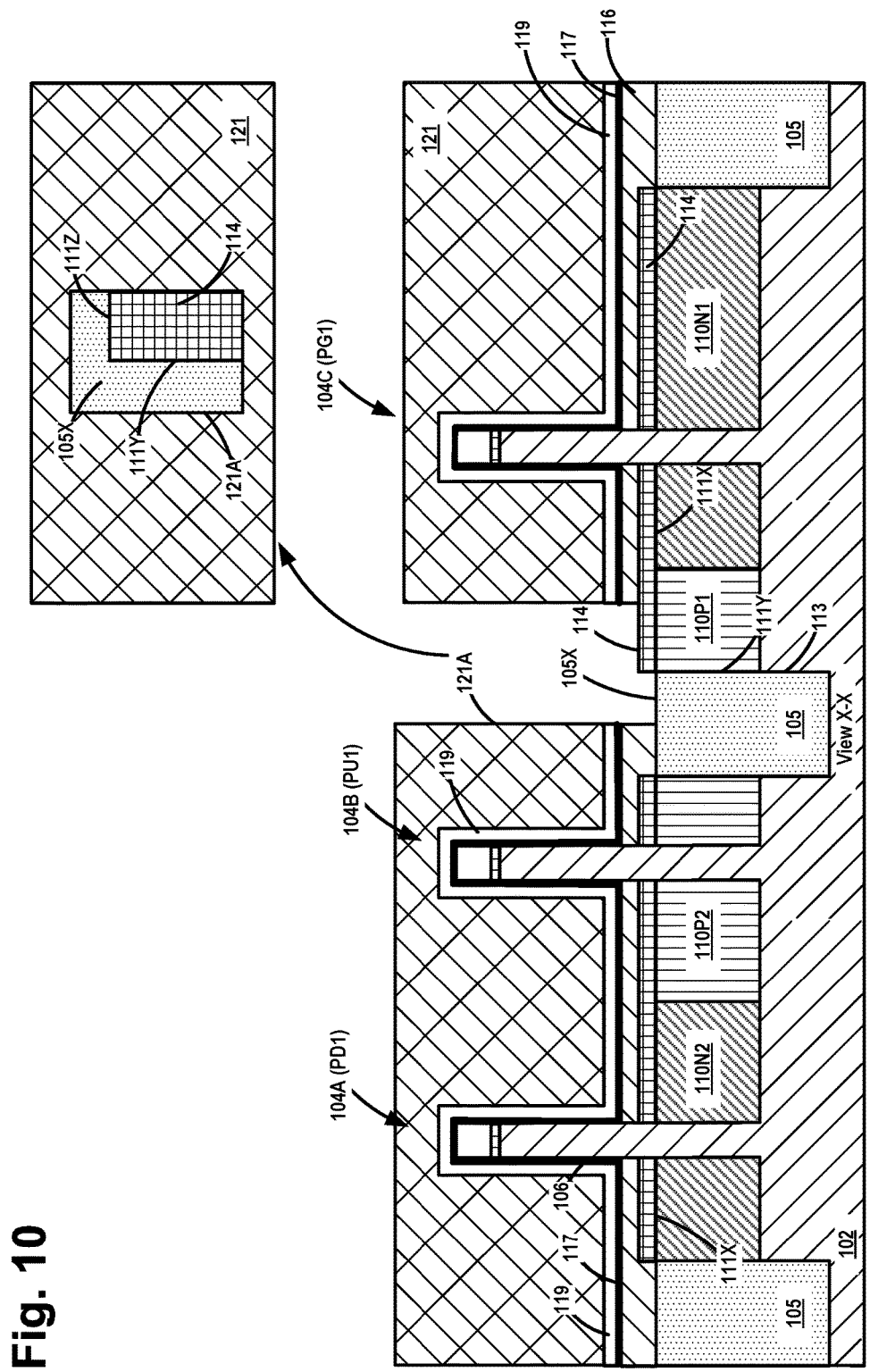

FIG. 10 depicts the IC product 100 after one or more etching processes were performed through the patterned etch mask 121 to sequentially remove the exposed portion of the conformal sacrificial protection layer 119, the gate insulation layer 117 and the bottom spacer layer 116. As depicted, in one illustrative process flow, this process operation exposes a portion of an upper surface 105X of the isolation structure 105 positioned between the merged doped source/drain regions 103 and a portion of the metal silicide layer 114 positioned above the merged doped source/drain region 103A.

Figure 11:
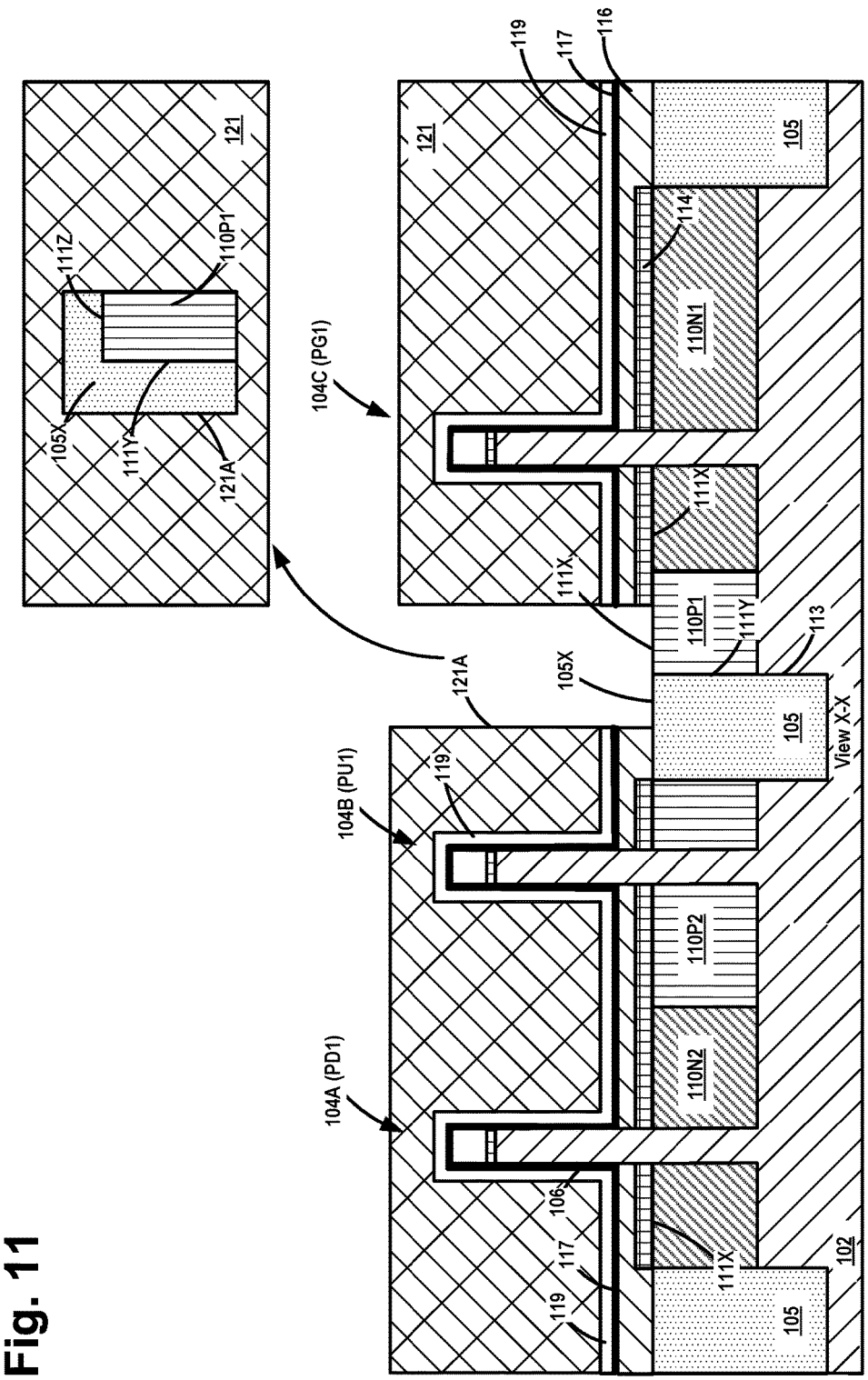

FIG. 11 depicts the IC product 100 after another etching process was performed through the patterned etch mask 121 to remove the exposed portion of the metal silicide layer 114. As depicted, in one illustrative process flow, this process operation exposes a portion of the upper surface 111X of the merged doped source/drain region 103A, and more specifically, the upper surface 111X of the bottom P-doped source/drain region 110P1. Of course, as noted above, in some process flows, the exposed portion of the metal silicide layer 114 (if present) may not be removed prior to performing the process operations described below.

Figure 12:
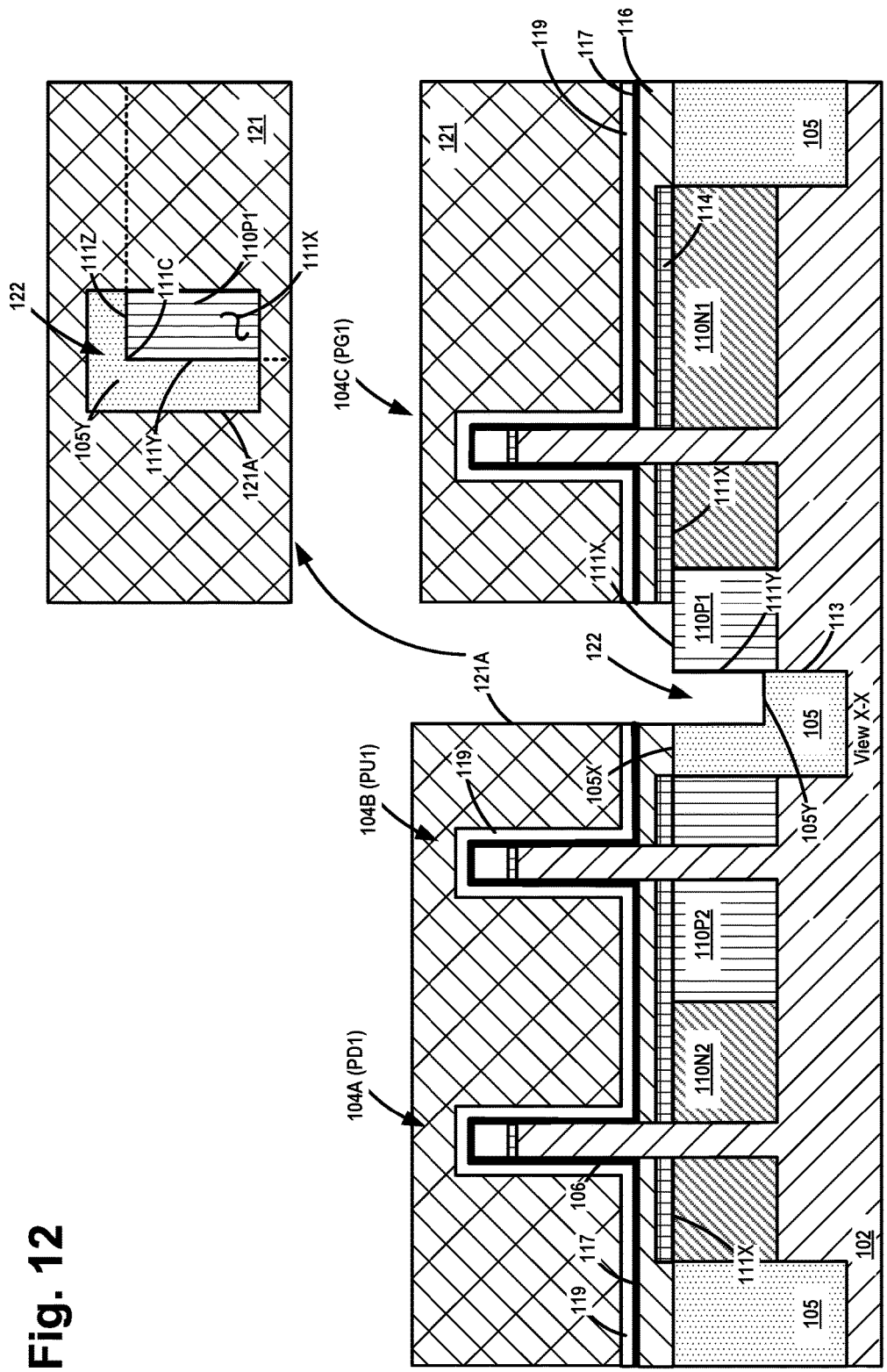
Figure 17:
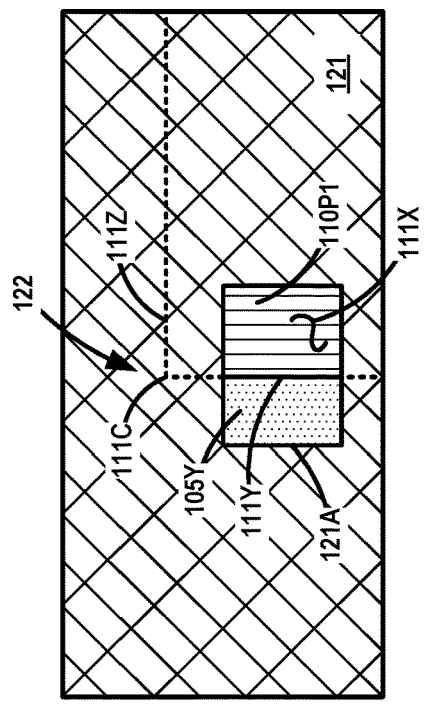
Figure 18:
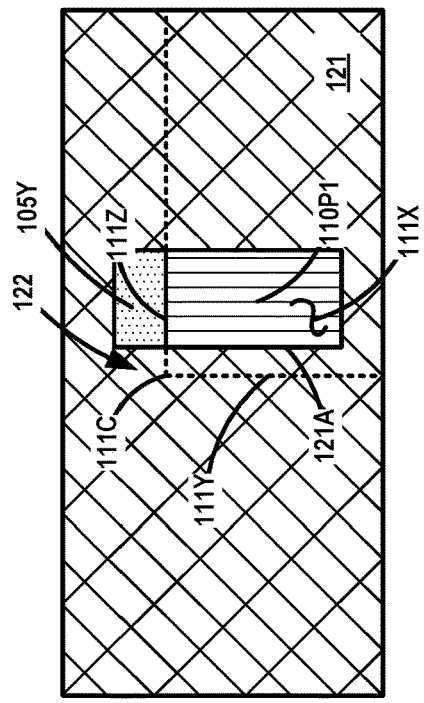

FIG. 12 depicts the IC product 100 after a timed etching process was performed through the patterned etch mask 121 to remove a portion of the isolation structure 105 and form a contact trench 122 having a bottom surface 105Y within the isolation structure 105. As depicted, in one illustrative process flow, this process operation exposes at least a portion of the side surfaces 111Y and 11Z of the merged doped source/drain region 103A, and more specifically, the side surfaces 111Y and 11Z of the bottom P-doped source/drain region 110P1. This process operation also exposes at least a portion of the corner 111C (see plan view) of the bottom P-doped source/drain region 110P1. A simplistic plan view in the upper right of FIG. 12 depicts the product after this process operation was performed. However, as noted above, in some applications, the contact trench 122 within the isolation structure may expose only one of the side surfaces 111Y, 111Z and not expose the corner 111C. This may be accomplished by changing the size and/or position of the opening 121A in the patterned etch mask 121. Even if the contact trench 122 exposes only one of the side surfaces 111Y or 111X, the resulting contact structure 109 formed in such a trench 122 would still provide more surface contact area as compared to a contact structure that would only contact the upper surface 111X. FIG. 17 is a simplistic plan view that depicts the product after a contact trench 122 was formed that exposes only the side surface 111Y. FIG. 18 is a simplistic plan view that depicts the product after a contact trench 122 was formed that exposes only the side surface 111Z. The remainder of the drawings will depict the situation where the contact trench 122 is formed so as to expose all of the surfaces 111Y, 111C and 111Z. After formation of the contact trench 122, if desired, metal silicide material (not shown) may be formed on exposed portions of the merged doped source/drain region 103. If metal silicide material, such as the metal silicide layer 114 depicted herein, is already present on the upper surface 111X, then additional silicide material would only form on the exposed portions of the surfaces 111Y, 111Z and 111C.

Figure 13:
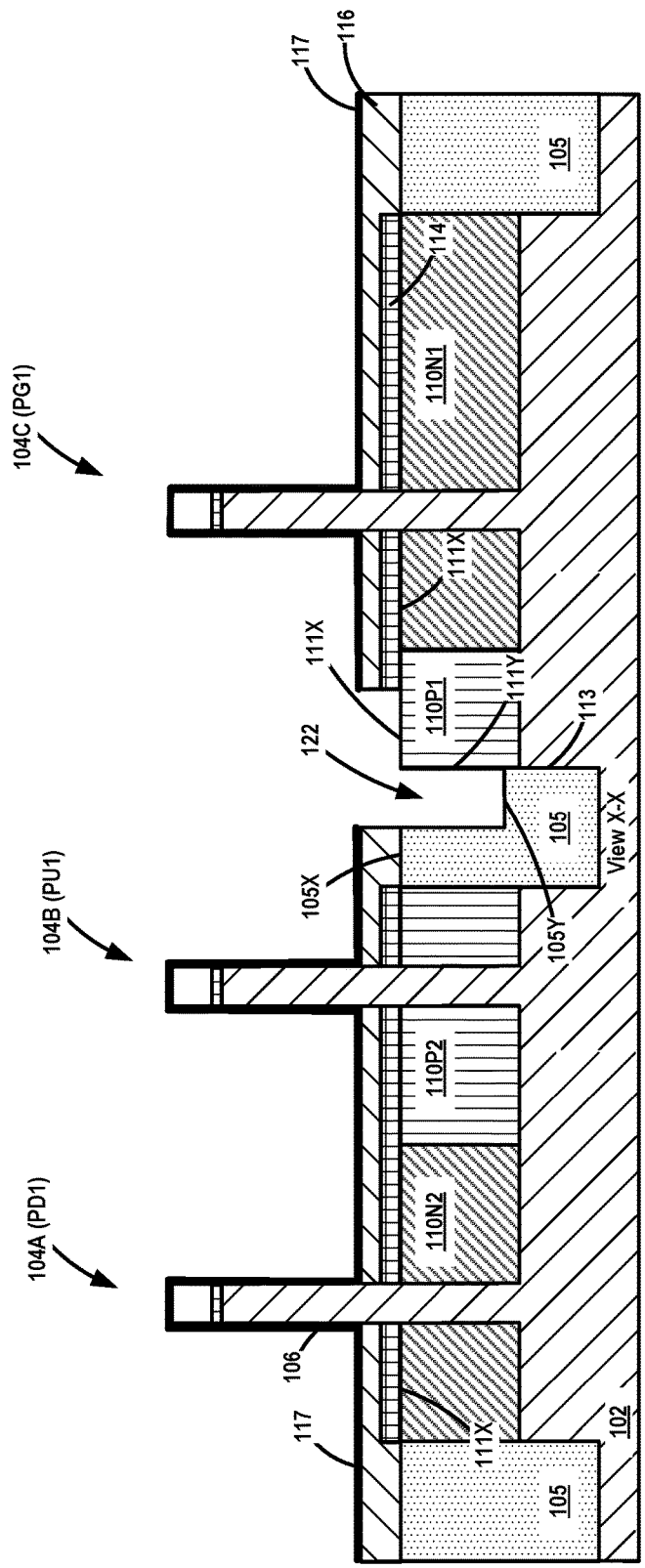

FIG. 13 depicts the IC product 100 after several process operations were performed. First, an etching process was performed to remove the above-described patterned etch mask 121 selectively relative to surrounding materials. Then, another etching process was performed to remove the above-described conformal sacrificial protection layer 119 selectively relative to gate insulation layer 117.

Figure 14:
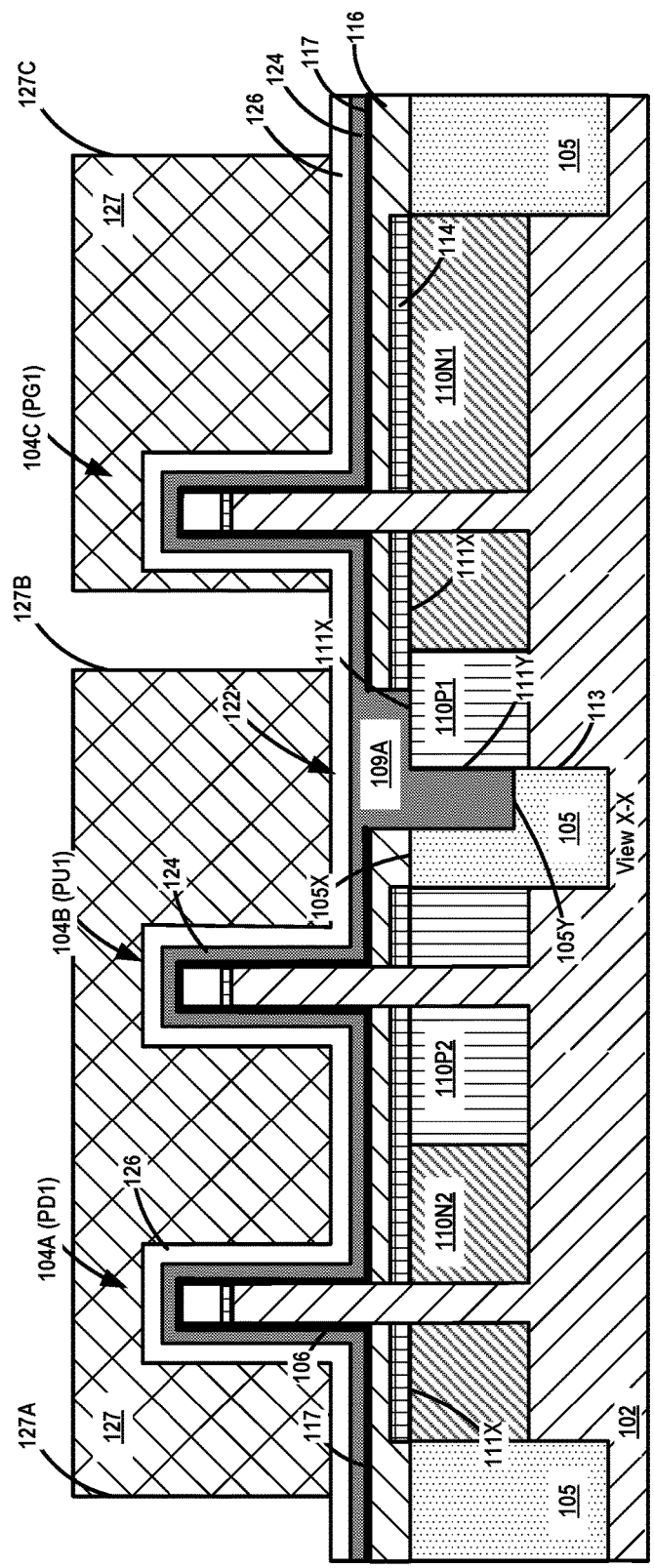

FIG. 14 depicts the IC product 100 after several process operations were performed. First, a continuous conformal layer of conductive gate electrode material 124 was deposited on the gate insulation layer 117 between and around the VOCS structures 106 for all of the transistors 104. Thereafter, another conformal deposition process was performed to form a conformal layer of insulating material 126, above the layer of conductive gate electrode material 124. Although simplistically depicted as a single layer of material, the layer of conductive gate electrode material 124 may actually be comprised of multiple layers of conductive material. As depicted, in one illustrative example, the layer of conductive gate electrode material 124 substantially overfills the contact trench 122. However, in other applications, depending upon the physical size of the contact trench 122 and the thickness of the layer of conductive gate electrode material 124, the contact trench 122 may not be completely filled. The portion of the continuous layer of conductive gate electrode material 124 positioned above the second merged doped source/drain region 103B will serve as at least part of a conductive gate structure for at least one transistor device formed above the second merged doped source drain region 103B. The portion of the continuous layer of conductive gate electrode material in the contact trench 122 and above the upper surface 111X of the first merged doped source/drain region 103A constitute the cross-coupled contact structure 109A. In one illustrative example, the cross-coupled contact structure 109A conductively contacts the exposed side surfaces 111Y and 111Z as well as the corner 111C of the first merged doped source/drain region 103A. In the illustrative example depicted in FIG. 14, the portion of the cross-coupled contact structures 109 positioned above the upper surface 111X of the first merged doped source/drain region 103A physically contacts the upper surface 111X. It should be noted that the contact structures 109 disclosed herein will be formed from at least one of the one or more conductive materials used to form the conductive gate electrode structures for the vertical transistor devices 104 disclosed herein, i.e., the contact structures 109 are an extension of the continuous layer of conductive gate electrode material(s) for a transistor device. Stated another way, the contact structure 109 and the gate structure 107A are formed from the same continuous layer of conductive gate electrode material 124. The layer of conductive gate electrode material 124 may be formed to any desired thickness, and it may be comprised of any desired conductive materials, e.g., one or more work function metals, etc. The conformal layer of insulating material 126 may be formed to any desired thickness, and it may be comprised of any desired insulating material, e.g., silicon nitride, etc.

Still referencing FIG. 14, another patterned etch mask 127, e.g., OPL was formed above the conformal layer of insulating material 126 using techniques described above with respect to the formation of the patterned etch mask 121. The patterned etch mask 127 has a plurality of openings 127A-C that are positioned above portions of the conformal layer of insulating material 126 and the layer of conductive gate electrode material 124 that are to be removed so as to at least partially define the discrete conductive gate structures 107A-D (see FIG. 4).

Figure 15:
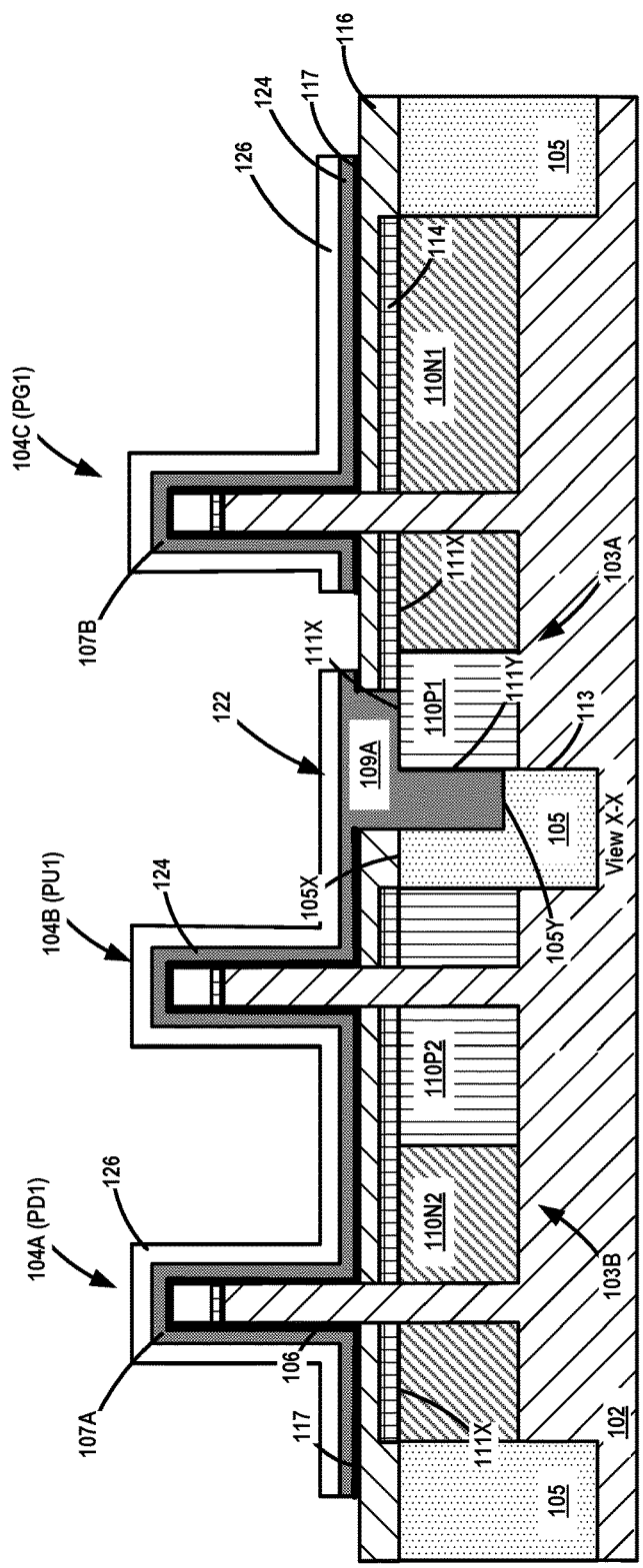

FIG. 15 depicts the IC product 100 after one or more etching processes were performed through the patterned etch mask 127 to sequentially remove the exposed portions of the conformal layer of insulating material 126, the layer of conductive gate electrode material 124 and the gate insulation layer 117. As depicted, in one illustrative process flow, this process operation stops at the bottom layer of spacer material 116 and results in at least the partial formation of the discrete gate structures 107A and 107B. As depicted the cross-coupled contact structure 109A conductively couples the gate structure 107A (shared by the transistors PD1 and PU1) with the first merged doped source drain region 103A. Of course, as will be appreciated by those skilled in the art, other process operations may need to be performed to completely form the discrete gate structures 107A-D, such as additional etching processes to completely pattern the gate electrode material(s). Thereafter, the patterned etch mask 127 was removed.

At this point in the process flow, traditional manufacturing operations may be performed to complete the fabrication of the IC product 100. For example, one or more layers of insulating material (not shown) may be formed above the product shown in FIG. 15 and various conductive contact structures (not shown), such as contact structures to contact other areas of the bottom source/drain regions may be formed in these additional layers of insulating material. However, since the cross-coupled contact structures 109 disclosed herein would have already been formed and conductively coupled to their appropriate structures, there is no need for a conductive contact to be formed through these additional layers of insulating material so as to contact the cross-coupled contact structures 109 disclosed herein. Thus, the cross-coupled contact structures 109 disclosed herein may be considered to be "buried" cross-coupled contact structures 109 as they are positioned under these additional layers of insulating material and there is no need to form a conductive contact structure to the cross-coupled contact structures 109 disclosed herein.

Figure 16:
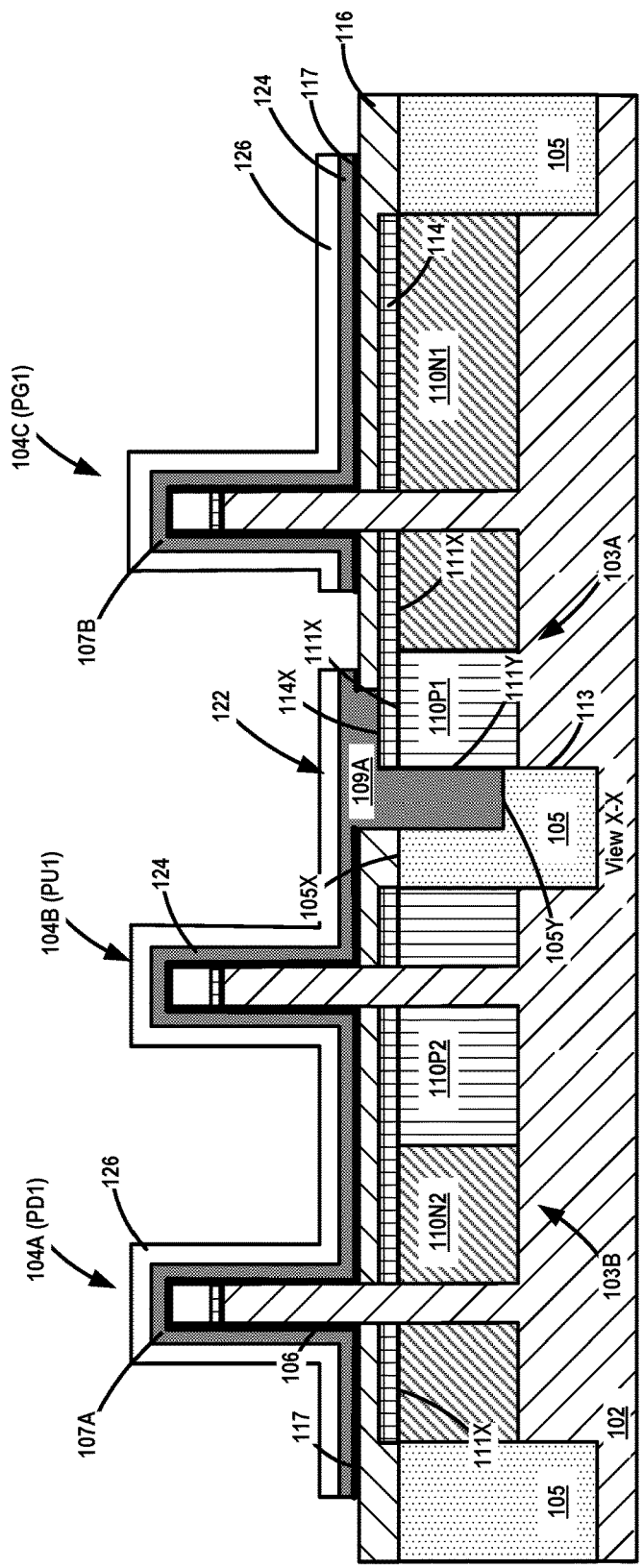

As noted above with respect to the discussion regarding FIGS. 10 and 11, FIG. 16 depicts an embodiment of the IC product 100 wherein the portion of the metal silicide layer 114 positioned above the first merged doped source/drain region 103A and exposed by the opening 121A was not removed prior to the formation of the cross-coupled contact structure 109A. As before, in this embodiment, the contact structure 109A conductively contacts the exposed side surfaces 111Y and 111Z as well as the corner 111C of the first merged doped source/drain region 103A. Additionally, as before, in the illustrative example depicted in FIG. 16, a portion of the contact structure 109A is positioned above the upper surface 111X of the first merged doped source/drain region 103A. However, in the embodiment depicted in FIG. 16, the cross-coupled contact structure 109A physically contacts the upper surface 114X of the metal silicide layer 114.

As will be appreciated by those skilled in the art after a complete reading of the present application, there are various embodiments of the contact structures 109 disclosed herein as well as various methods of making such contact structures 109. In one example, an IC product disclosed herein includes a first merged doped source/drain region 103A that comprises a first doped region 110P1 and a second doped region 110N1. The first merged doped source/drain region 103A comprises an upper surface 111X, a first side surface 111Y and a second side surface 111Z that intersect one another at a corner 111C of the first merged doped source/drain region 103A. In this example, the product also includes a second merged doped source/drain region 103B, an isolation structure 105 positioned between the merged doped source/drain regions 103A, 103B and a contact trench 122 formed in the isolation structure. The product also includes a conductive gate structure 124 for at least one transistor device (e.g., 104A, 104B) positioned above the second merged doped source/drain region 103B, the conductive gate structure 124 being positioned above at least the second merged doped source/drain region 103B, and a cross-coupled contact structure 109A that comprises a first portion (the downwardly extending portion(s) of the contact structure such as, for example, the portions 109-1 and/or 109-2—see FIGS. 6 and 7) positioned within the contact trench 122 laterally adjacent to and conductively coupled to at least one of the first side surface 111Y and the second side surface 111Z and a second portion (109-3—see FIGS. 6 and 7) that is positioned above and conductively coupled to the upper surface 111X of the first merged doped source/drain region 103A, wherein the cross-coupled contact structure 109A is conductively coupled to the conductive gate structure 124.

In other embodiments, the contact structure is conductively coupled to each of the first side surface 111Y, the second side surface 111Z and the upper surface 111X of the first merged doped source/drain region 103A. In yet other embodiments, the contact structure may only physically contact one of the side surfaces 111Y or 111Z. In another example, the first portion of the contact structure is in physical contact with at least one of the side surfaces 111Y, 111Z and the second portion is in physical contact with the upper surface 111X. In yet further embodiments, the IC product comprises a metal silicide layer 114 positioned on and in physical contact with the upper surface 111X of the first merged doped source/drain region 103A, wherein the contact structure is in physical contact with an upper surface 114X of the metal silicide layer 114.

One illustrative method disclosed herein includes forming a first merged doped source/drain region 103A in a semiconductor material, the merged doped source/drain region 103A comprising an upper surface 111X, a first side surface 111Y and a second side surface 111Z, wherein the first and second side surfaces intersect one another at a corner 111C of the merged doped source/drain region 103A, forming a second merged doped source/drain region 103B, and forming a contact trench 122 in an isolation structure 105 located between the merged doped source/drain regions 103A, 103B so as to thereby expose at least a portion of at least one of the first side surface 111Y and the second side surface 111Z of the first merged doped source/drain region 103A. In this example, the method also includes forming a conductive gate structure 124 for at least one transistor device positioned above the second merged doped source/drain region 103B, the conductive gate structure 124 being positioned above at least the second merged doped source/drain region 103B and forming a cross-coupled contact structure 109 having a first portion of the contact structure that is positioned within the trench 122 laterally adjacent to and conductively coupled to the at least one of the first side surface 111Y and the second side surface 111Z and a second portion of the contact structure that is positioned vertically above and conductively coupled to the upper surface 111X, wherein the cross-coupled contact structure 109A is conductively coupled to the conductive gate structure 124.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An integrated circuit product, comprising:
 a first merged doped source/drain region comprising an upper surface, a first side surface and a second side surface, said first and second side surfaces intersecting one another at a corner of said first merged doped source/drain region;
 a second merged doped source/drain region;
 an isolation structure positioned between said first merged doped source/drain region and said second merged doped source/drain region;
 a contact trench in said isolation structure;
 a conductive gate structure for at least one transistor device, said conductive gate structure being positioned above at least said second merged doped source/drain region; and
 a cross-coupled contact structure that comprises a first portion and a second portion, wherein at least a portion of said first portion of said cross-coupled contact structure is positioned within said contact trench laterally adjacent to and conductively coupled to at least one of said first side surface and said second side surface, and wherein said second portion of said cross-coupled contact structure is positioned above and conductively coupled to said upper surface of said first merged doped source/drain region and wherein said cross-coupled contact structure is conductively coupled to said conductive gate structure.

2. The integrated circuit product of claim 1, wherein said first side surface and said second side surface extend downwardly from said upper surface.

3. The integrated circuit product of claim 1, wherein said contact trench is a continuous trench that extends along at least a portion of said first side surface, around said corner of said first merged doped source/drain region and along at least a portion of said second side surface, and wherein said first portion of said cross-coupled contact structure is conductively coupled to each of said first side surface, said corner and said second side surface of said first merged doped source/drain region.

4. The integrated circuit product of claim 3, wherein said first portion of said cross-coupled contact structure is in physical contact with and conductively coupled to each of said first side surface, said corner and said second side surface and wherein said second portion of said cross-coupled contact structure is in physical contact with and conductively coupled to said upper surface of said first merged doped source/drain region.

5. The integrated circuit product of claim 1, further comprising metal silicide material positioned between said second portion of said cross-coupled contact structure and said upper surface of said first merged doped source/drain region, wherein said second portion of said cross-coupled contact structure is in physical contact with and conductively coupled to said metal silicide material.

6. The integrated circuit product of claim 1, further comprising:
 a first N-type pull-down transistor and a first P-type pull-up transistor, both of which are formed above said second merged doped source/drain region, wherein said conductive gate structure is a first shared conductive gate structure that is shared by both said first N-type pull-down transistor and said first P-type pull-up transistor; and
 a second N-type pull-down transistor and a second P-type pull-up transistor formed above said first merged doped source/drain region, each of said second N-type pull-down transistor and said second P-type pull-up transistor comprising a drain region, wherein said cross-coupled contact structure conductively couples said first shared conductive gate structure to said drain region of both said second N-type pull-down transistor and said second P-type pull-up transistor.

7. The integrated circuit product of claim 6, wherein said cross-coupled contact structure is a first cross-coupled contact structure, further comprising:
 a first N-type pass gate transistor formed above said second merged doped source/drain region;
 a second N-type pass gate transistor formed above said first merged doped source/drain region;
 a second shared conductive gate structure that is shared by both said second N-type pull-down transistor and said second P-type pull-up transistor; and
 a second cross-coupled contact structure that conductively couples said second shared conductive gate structure to a drain region of each of said first N-type pull-down transistor and said first P-type pull-up transistor thereby forming an SRAM cell.

8. The integrated circuit product of claim 1, further comprising a metal silicide material positioned between said first portion of said cross-coupled contact structure and at least one of said first and second side surfaces, wherein said first portion of said cross-coupled contact structure is in physical contact with and conductively coupled to said metal silicide material.

9. The integrated circuit product of claim 1, wherein said first portion of said cross-coupled contact structure is positioned laterally adjacent to only one of said first and second side surfaces.

10. The integrated circuit product of claim 1, wherein each of said first and second merged doped source/drain regions comprises a first doped region of a first type and a second doped region of a second type that is opposite said first type, said first doped region and said second doped region engaging one another along an interface.

11. The integrated circuit product of claim 1, wherein said first merged doped source/drain region comprises a first P-doped region and a second N-doped region that engage one another along an interface within said first merged doped source/drain region, said first P-doped region comprising said first side surface, said corner, said second side surface and said upper surface, wherein said at least one transistor device is a vertical transistor device and wherein said conductive gate structure is further positioned above only a portion of said first merged doped source/drain region.

12. The integrated circuit product of claim 1, wherein said conductive gate structure and said cross-coupled contact structure are formed form at least one continuous layer of at least one conductive material.

13. An integrated circuit product, comprising:
 a first merged doped source/drain region comprising an upper surface, a first side surface and a second side surface, said first and second side surfaces intersecting one another at a corner of said first merged doped source/drain region, wherein said first side surface and said second side surface extend downwardly from said upper surface;
 a second merged doped source/drain region;

an isolation structure positioned between said first merged doped source/drain region and said second merged doped source/drain region;

a continuous contact trench formed in said isolation structure, said continuous contact trench extending along at least a portion of said first side surface, around said corner and along at least a portion of said second side surface;

a conductive gate structure for at least one transistor device, said conductive gate structure being positioned above at least said second merged doped source/drain region; and a cross-coupled contact structure that comprises a first portion and a second portion, wherein at least a portion of said first portion of said cross-coupled contact structure is positioned within said continuous contact trench laterally adjacent to and conductively coupled to each of said first side surface, said corner, and said second side surface, and wherein said second portion of said cross-coupled contact structure is positioned above and conductively coupled to said upper surface of said first merged doped source/drain region and wherein said cross-coupled contact structure is conductively coupled to said conductive gate structure.

14. The integrated circuit product of claim 13, wherein said first portion of said cross-coupled contact structure is in physical contact with said first side surface, said corner and said second side surface of said first merged doped source/drain region.

15. The integrated circuit product of claim 14, wherein said second portion of said cross-coupled contact structure is in physical contact with said upper surface of said first merged doped source/drain region.

16. The integrated circuit product of claim 13, further comprising metal silicide material positioned between said second portion of said cross-coupled contact structure and said upper surface of said first merged doped source/drain region, wherein said second portion of said cross-coupled contact structure is in physical contact with and conductively coupled to said metal silicide material.

17. A method, comprising:

forming a first merged doped source/drain region, said first merged doped source/drain region comprising an upper surface, a first side surface and a second side surface, said first and second side surfaces intersecting one another at a corner of said first merged doped source/drain region;

forming a second merged doped source/drain region;

forming a contact trench in an isolation structure positioned between said first merged doped source/drain region and said second merged doped source/drain region so as to thereby expose at least a portion of at least one of said first side surface and said second side surface of said first merged doped source/drain region;

forming a conductive gate structure for at least one transistor device, said conductive gate structure being positioned above at least said second merged doped source/drain region; and forming a cross-coupled contact structure having a first portion and a second portion, said first portion of said cross-coupled contact structure being formed within said contact trench laterally adjacent to and conductively coupled to said at least one of said first side surface and said second side surface, said second portion of said cross-coupled contact structure being formed vertically above and conductively coupled to said upper surface, wherein said cross-coupled contact structure is conductively coupled to said conductive gate structure.

18. The method of claim 17, wherein forming said contact trench comprises forming a continuous contact trench that extends along at least a portion of said first side surface, around said corner of said first merged doped source/drain region and along at least a portion of said second side surface, and wherein said first portion of said cross-coupled contact structure is formed such that it is conductively coupled to each of said first side surface, said corner and said second side surface of said first merged doped source/drain region.

19. The method of claim 17, wherein forming said first and second merged doped source/drain regions comprises forming said first and second merged doped source/drain regions such that each of said first and second merged doped source/drain regions comprise a first doped region of a first type and a second doped region of a second type that is opposite said first type, said first doped region and said second doped region engaging one another along an interface.

20. The method of claim 17, wherein forming said conductive gate structure and said cross-coupled contact structure comprises forming at least one continuous layer of conductive material so as to form at least a portion of the said conductive gate structure and said cross-coupled contact structure from the same at least one continuous layer of conductive material.

* * * * *